United States Patent
Abe

(10) Patent No.: US 7,262,642 B2
(45) Date of Patent: Aug. 28, 2007

(54) SEMICONDUCTOR INTEGRATED CIRCUIT COMPRISING FIRST AND SECOND TRANSMISSION SYSTEMS

(75) Inventor: Ichiro Abe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 220 days.

(21) Appl. No.: 11/203,980

(22) Filed: Aug. 16, 2005

(65) Prior Publication Data

US 2006/0038593 A1 Feb. 23, 2006

(30) Foreign Application Priority Data

Aug. 17, 2004 (JP) ............................. 2004-237451

(51) Int. Cl.
*H03B 1/00* (2006.01)
(52) U.S. Cl. ...................................... 327/108; 327/112
(58) Field of Classification Search ................. 327/50, 327/108, 112, 27.6, 278, 333; 326/26, 27, 326/57, 58, 83, 87
See application file for complete search history.

(56) References Cited

U.S. PATENT DOCUMENTS

| 6,774,695 | B2 | 8/2004 | Hayashi et al. ............. | 327/333 |
| 6,794,909 | B1 * | 9/2004 | Urakami et al. ............. | 327/112 |
| 2004/0227558 | A1 | 11/2004 | Hayashi et al. ............. | 327/333 |

FOREIGN PATENT DOCUMENTS

| JP | 6-208790 A | 7/1994 |
| JP | 5-7147 A | 1/1998 |
| JP | 2002-135107 A | 5/2002 |

* cited by examiner

*Primary Examiner*—Linh My Nguyen
(74) *Attorney, Agent, or Firm*—Sughrue Mion, PLLC

(57) ABSTRACT

Disclosed is a semiconductor integrated circuit that comprises first and second transmission systems, each comprising a plurality of transistors; and an output select unit. Transistors constituting said first transmission system comprise transistors having relatively high threshold values and being turned off and transistors having relatively low threshold values and being turned on, when the input signal supplied to said first transmission system takes a first value; and transistors constituting said second transmission system, comprise transistors having relatively high threshold values and being turned off and transistors have relatively low threshold values and being turned on, when an input signal supplied to said second transmission system assumes a second value. The output select unit, receiving outputs from said first and second transmission systems, outputs from an output terminal thereof an output of the transmission system where the relatively low threshold transistors are in an on-state, in active state, and said output select unit cuts off an output of the transmission system with an unstable output and outputs from said output terminal an output of the transmission system with a stable output, in a standby mode.

13 Claims, 9 Drawing Sheets

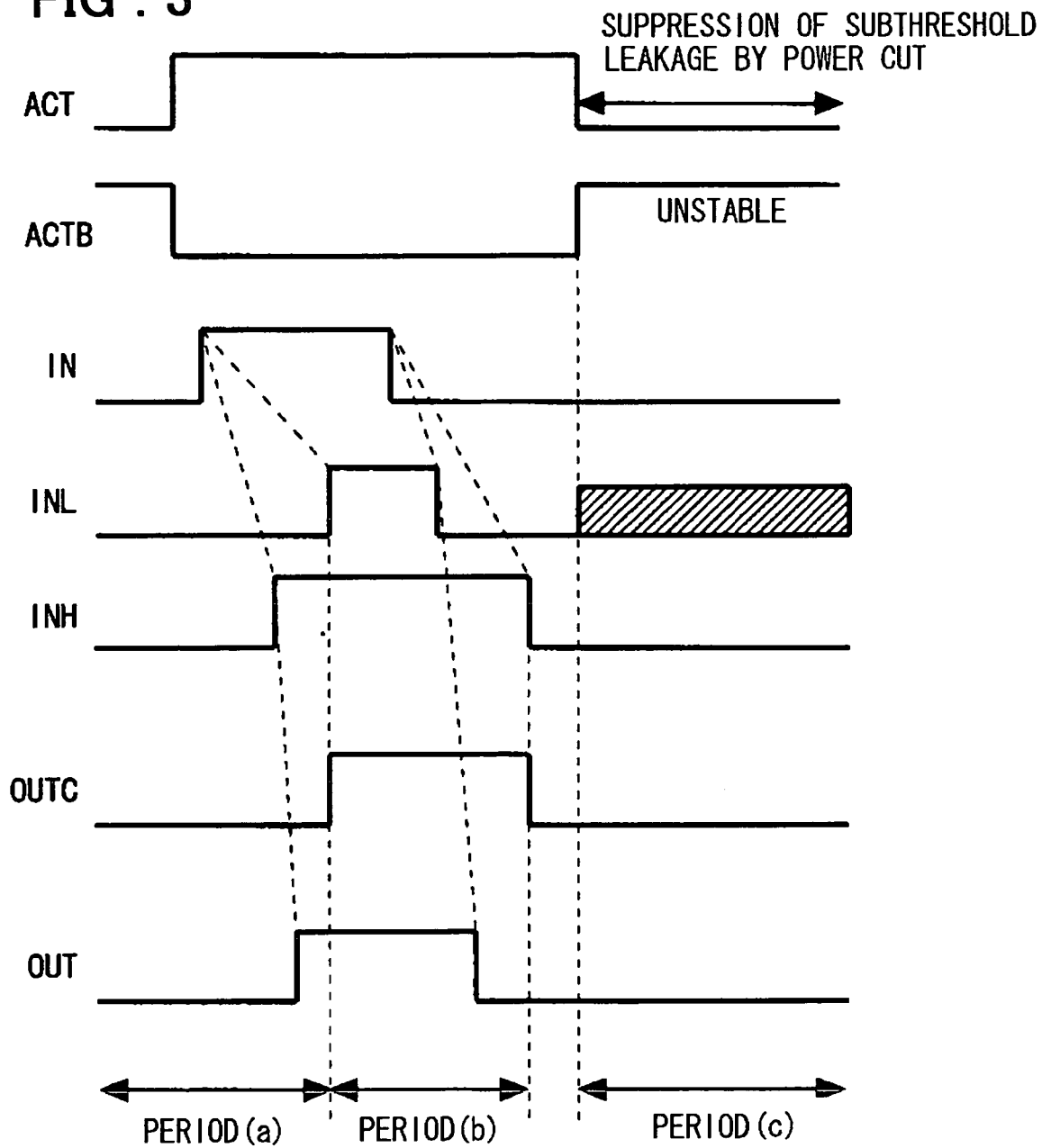

SEMICONDUCTOR INTEGRATED CIRCUIT COMPRISING FIRST AND SECOND TRANSMISSION SYSTEMS

FIELD OF THE INVENTION

The present invention relates to a semiconductor integrated circuit, and particularly to a semiconductor integrated circuit suitable for a high-speed operation with a low voltage and for suppressing the subthreshold leakage in a standby mode.

BACKGROUND OF THE INVENTION

In recent years, a power supply voltage of a semiconductor integrated circuit is becoming lower and lower. One way to achieve a high-speed operation while lowering the power supply voltage is to lower the threshold value of a transistor, however, in this case, the subthreshold leakage in a standby mode cannot be ignored.

As a countermeasure to this, for instance, a configuration shown in FIG. 7 is disclosed in Patent Document 1. In reference to FIG. 7, this configuration comprises fourth stages of CMOS inverters. The first stage CMOS inverter comprises a P-channel MOS transistor PM1 having a source thereof connected to a high-level power supply VDD and an N-channel MOS transistor NM1 having a source thereof connected to a low-level power supply GND and a drain thereof connected in common with the drain of the P-channel MOS transistor PM1 to an output end. The gates of the P-channel MOS transistor PM1 and N-channel MOS transistor NM1 are connected in common to an input terminal IN. The second stage CMOS inverter comprises a P-channel MOS transistor PM2 and a N-channel MOS transistor NM2, with gates of the P-channel MOS transistor PM1 and N-channel MOS transistor NM1 connected in common to the output end of the first stage CMOS inverter. The third stage CMOS inverter comprises a P-channel MOS transistor PM3 and a N-channel MOS transistor NM3, with gates of the P-channel MOS transistor PM3 and N-channel MOS transistor NM13 connected in common to the output end of the second stage CMOS inverter. The fourth stage CMOS inverter comprises a P-channel MOS transistor PM4 and a N-channel MOS transistor NM4, with gates and drains of the P-channel MOS transistor PM4 and N-channel MOS transistor NM4 connected in common to the output end of the third stage CMOS inverter and with an output terminal OUT. The N-channel MOS transistors NM1 and NM3, and the P-channel MOS transistors PM2 and PM4 have low threshold voltages.

In the configuration shown in FIG. 7, on the side that is in an off-state during a standby mode, transistors (PM1, NM2, PM3, and NM4) with threshold values high enough so that subthreshold leakage thereof is acceptable, are used, and on the side that is in an on-state during the standby mode, transistors with low threshold values (NM1, PM2, NM3, and PM4) that meets the demand for high-speed operation are used.

During an operation mode (active mode), the on-state transistors with low threshold values (NM1, PM2, NM3, and PM4) are used to achieve high-speed operation, and by turning off the transistors with high threshold values during the standby mode (the input terminal IN is at a low level), the demand for high-speed operation is met and the subthreshold leakage during the standby mode can be reduced. In other words, during the rising transition when an input signal rises from a low level to a high level, the transistors with low threshold values (NM1, PM2, NM3, and PM4) are turned on and an output signal from the output terminal OUT rises from a low level to a high level promptly.

Meanwhile, as another means for achieving high-speed operation, for instance, a configuration shown in FIG. 8 is disclosed in Patent Document 2. As shown in FIG. 8, this configuration achieves high-speed operation by comprising two paths: a transmission system 1A where the level of an input signal supplied to an input terminal IN changes from a high level to a low level at high speed and a transmission system 2A where the level of the input signal supplied to the input terminal IN changes from a low level to a high level at high speed, and a circuit 6A, to which the output signals from these two transmission systems 1A and 2A are fed, having the function of receiving the output from one of the transmission systems where the signal level changes at high speed and outputting it (CMOS transfer gates TG1 and TG2).

In the circuit shown in FIG. 8, in the transmission system 1A, the driving capability (for instance, W/L ratio—the ratio between the gate width and gate length) of the transistors (PM101 and NM102) that are in an on-state when the input signal supplied to the input terminal IN is at a low level is increased, making the level change of the input signal from a high level to a low level high speed. On the other hand, in the transmission system 2A, the driving capability of the transistors (NM201 and PM202) that are in an on-state when the input signal supplied to the input terminal IN is at a high level is increased, making the level change of the input signal from a low level to a high level high speed.

Furthermore, an output selector unit 5A comprises five stages of inverters 51 to 55 (delay circuit), outputs of the inverter 54 and an the inverter 55 are connected respectively to gates of an N-channel MOS transistor and a P-channel MOS transistor of the CMOS transfer gate TG1, and outputs of the inverter 54 and the inverter 55 are connected respectively to gates of a P-channel MOS transistor and the gate of an N-channel MOS transistor of the CMOS transfer gate TG2. The CMOS transfer gate TG1 is in an on-state when an output signal from an output terminal OUT is at a high level, and the CMOS transfer gate TG2 is in an on-state when the output signal is at a low level. For the rising transition of the input signal from a low level to a high level, a signal (rising transition) is outputted from the output terminal OUT via the on-state transfer gate TG2, and for the falling transition of the input signal from a high level to a low level, a signal (falling transition) is outputted from the output terminal OUT via the on-state transfer gate TG1.

It is configured such that the output signal is delayed by the delay circuit for the input signal that changes from a high level to a low level at high speed, the transfer gate TG2 connected in series to the path of the INH side is turned on when both INL and INH are at a low level, and the transfer gate TG1 connected in series to the path of the INL side is turned on when the both are at a high level. With such a configuration, only the input signal (edge) from the side that changes at high speed can be received and outputted.

Furthermore, for instance, a configuration shown in FIG. 9 is disclosed in Patent Document 3, as a circuit where high-speed operation is made possible by having two input signals and receiving and outputting only the input signal that changes at high speed. In reference to FIG. 9, an open/close control signal generation unit 5B comprises two P-channel MOS transistors PM81 and PM 82 connected in series between a high-level power supply VDD and a low-level power supply GND (ground) and two N-channel MOS transistors NM81 and NM82. Gates of the P-channel MOS transistor PM81 and the N-channel MOS transistor NM81 are connected to an input terminal INF (high-speed falling), and gates of the P-channel MOS transistor PM82 and the N-channel MOS transistor NM82 are connected to an input terminal INR (high-speed rising). Further, this circuit also comprises P-channel MOS transistors PM83 and PM84 having whose sources are connected in common to a high-level power supply VDD, whose gates are connected to a common drain node (M1) of the transistors PM82 and NM82 and to a low-level power supply GND respectively, and whose drains are connected in common, a P-channel MOS transistor PM85 having a source thereof connected to the commonly coupled drains of the P-channel MOS transistors PM83 and PM84, having a gate thereof connected to INF, and having a drain thereof connected to an output terminal OUT, N-channel MOS transistors NM83 and NM84 whose sources are connected in common to a low-level power supply GND, whose gates are connected to the common drain node (M1) of the transistors PM82 and NM82 and to a high-level power supply VDD respectively, and whose drains are connected in common, and an N-channel MOS transistor NM85 having a source thereof connected to the common drain of the N-channel MOS transistors NM83 and NM84, having a gate thereof connected to INR, and having a drain thereof connected to the output terminal OUT.

As described above, the open/close control signal generation unit 5B comprises the inverters (PM81, PM82, NM82, and NM81), which, when the values of two input signals of the input terminals INF and INR are identical, invert the value and output the result to the node M1, and when the values are not identical, place the node M1 in a floating state.

In other words, when the input terminals INF and INR are both at a low level, the P-channel MOS transistors PM81 and PM82 are in an on-state, the N-channel MOS transistors NM81 and NM82 are in an off-state, and the node M1 goes to a power supply potential VDD (high level). At this time, since the N-channel MOS transistor NM83 is turned on, the P-channel MOS transistor PM83 is turned off, the N-channel MOS transistor NM85 is turned off, and the P-channel MOS transistor PM85 is turned on, the output terminal OUT is charged by the power supply VDD via the path of the P-channel MOS transistors PM84 and PM85, and an output signal goes to a high level.

On the other hand, when the input terminals INF and INR are both at a high level, the P-channel MOS transistors PM81 and PM82 are in an off-state, the N-channel MOS transistors NM81 and NM82 are in an on-state, and the node M1 goes to a low-potential power supply voltage GND (low level). At this time, since the P-channel MOS transistor PM83 is turned on, the N-channel MOS transistor NM83 is turned off, the P-channel MOS transistor PM85 is turned off, and the N-channel MOS transistor NM85 is turned on, the output terminal OUT is discharged via the path of the NM85 and NM84 and an output signal goes to a low level.

Furthermore, when the input terminal INF is at a low level and INR is at a high level, the P-channel MOS transistor PM81 is turned on, the P-channel MOS transistor PM82 is turned off, the N-channel MOS transistor NM81 is turned off, the N-channel MOS transistor NM82 is turned on, and the node M1 is in a floating state.

When the input terminal INF is at a high level and INR is at a low level, the N-channel MOS transistor NM81 is turned on, the N-channel MOS transistor NM82 is turned off, the P-channel MOS transistor PM81 is turned off, the P-channel MOS transistor PM82 is turned on, and the node M1 is in a floating state. The output is in a floating state when the values of INF and INR are not identical, and in order to avoid this, high resistance elements using transistors of the same polarity (PM83 and PM84, NM83 and NM84) are connected in parallel for the transistors PM85 and NM85 respectively.

[Patent Document 1]
Japanese Patent Kokai Publication No. JP-A-06-208790 (pp. 2-4, FIG. 1)

[Patent Document 2]
Japanese Patent Kokai Publication No. JP-A-05-7147 (pp. 1-4, FIG. 2)

[Patent Document 3]
Japanese Patent Kokai Publication No. JP-P2002-135107A (pp. 6-9, FIG. 1)

SUMMARY OF THE DISCLOSURE

The configuration, described referring to FIG. 7 and disclosed in the above-mentioned Patent Document 1, has the following problems:

The first problem is that the high-speed operation corresponding to the low threshold transistors is performed only for one transition out of the two transitions: the falling transition of an input signal from a high level to a low level and the rising transition from a low level to a high level, and for the other transition, it only operates at the speed corresponding to the high threshold value. The cause of this problem is that transistors with high threshold values have to be used for at least one of the two sides in order to suppress the subthreshold leakage during the standby mode.

The second problem is that data cannot be stored during the standby mode. The cause of this problem is that the circuit has to be reset before put into the standby mode because the input/output has to be fixed so that the transistors with high threshold values are turned off during the standby mode.

Meanwhile, the configuration, described referring to FIG. 8 and disclosed in the above-mentioned Patent-Document 2, has the following problems:

The first problem is that the subthreshold leakage cannot be suppressed. The cause of this problem is that a circuit using only low-threshold transistors such as this one cannot suppress the subthreshold leakage, although transistors with low threshold values have to be used in order to achieve high-speed operation with a low voltage.

The second problem is that it is difficult to control a shortwave signal. The cause of this problem is that, with a high-level output type and one-shot shortwave signal for instance, since an input that changes from a high level to a low level at high speed and an input that changes from a low level to a high level at high speed are at a high level for a very short period of time, it is very difficult to create a signal that switches on/off the wiring from the delay of an output during this period and set timing for it.

Furthermore, the configuration, described referring to FIG. 9 and disclosed in the above-mentioned Patent-Document 3, too, has the following problems:

The first problem is that the two inputs INF and INR cannot be unstable nor inverted during a standby mode. The cause of this problem is that the output becomes unstable or on-on current (through-current) occurs when one of the inputs becomes unstable or inverted since the both inputs INF and INR are directly connected to the gate of the output transistors PM85 and NM85.

A circuit in accordance with an aspect of the present invention comprises:

first and second transmission systems receiving in common an input signal supplied to a signal input terminal and having substantially identical logic configuration to each other, each comprising a plurality of transistors; and an output select unit; wherein said plurality of transistors constituting said first transmission system comprise transistors having relatively high threshold values and being turned off and transistors having relatively low threshold values and being turned on, when the input signal supplied to said first transmission system assumes a first value; and said plurality of transistors constituting said second transmission system, comprise transistors having relatively high threshold values and being turned off and transistors have relatively low threshold values and being turned on, when an input signal supplied to said second transmission system assumes a second value;

said first and second transmission systems each receiving a control signal and being set to an operation mode and a standby mode based on the control signal; and wherein said output select unit, receiving outputs from said first and second transmission systems, outputs from an output terminal thereof an output of the transmission system where the relatively low threshold transistors are in an on-state, when said first and second transmission systems are in active state, and said output select unit cuts off an output of the transmission system with an unstable output and outputs from said output terminal an output of the transmission system with a stable output when said first and second transmission systems are in a standby mode.

The present invention comprises: a first transistor with a relatively high threshold, having a control electrode for receiving the control signal and being set to an off-state in the standby mode, said first transistor provided between a first power supply and a common connection node of said transistors of the first conductivity-type with the relatively low threshold values, that constitute said first and second transmission systems; and a second transistor with a relatively high threshold, having a control electrode for receiving the control signal and being set to an off-state in the standby mode, said second transistor being provided between a second power supply and a common connection node of said transistors of the second conductivity-type with the relatively low threshold values, that constitute said first and second transmission systems.

A semiconductor integrated circuit in accordance with another aspect of the present invention comprises a reset unit for resetting input ends of each transmission system so that the high threshold transistors of the first and second transmission systems are turned off during the standby mode.

With the present invention, the reset unit may comprise: a first switch, provided between said signal input terminal and the input end of said first transmission system, and controlled to be set to an off-state and to an on-state, when said control signal indicates the standby mode and the operation mode, respectively;

a second switch provided between said signal input terminal and the input end of said second transmission system, and controlled to be set to an off-state and to an on-state, when said control signal indicates the standby mode and the operation mode, respectively;

a third switch, connected between the input end of said first transmission system and one of said first and second power supplies, and controlled to be set to an on-state and to an off-state, when said control signal indicates the standby mode and the operation mode, respectively; and a fourth switch connected between the input end of said second transmission system and the other one of said first and second power supplies, and controlled to be set to an on-state and to an off-state, when said control signal indicates the standby mode and the operation mode, respectively.

With the present invention, the output select unit may comprise:

a first circuit, connected to output ends of said first and second transmission systems, outputting from an output end thereof an output value corresponding to output values of said first and second transmission systems, when the output values of said first and second transmission systems are at the same logic level, and setting the output end into a floating state, when the output values of said first and second transmission systems are different;

a flip-flop circuit receiving and storing the output of said first circuit; and first and second transfer switches connected between the output end of said first transmission system and said output terminal, and the output end of said second transmission system and said output terminal respectively, each having a control electrode for receiving an output of said flip-flop circuit, and being controlled so that when one is turned on, the other is turned off.

The meritorious effects of the present invention are summarized as follows.

According to the present invention, an output from the side where a signal changes at high speed is outputted during the operation mode and an unstable signal is cut off when one of the signals is unstable during the standby mode by receiving two signals: a signal whose input changes from a high level to a low level at high speed and a signal whose input changes from a low level to a high level at high speed in the configuration where the connection between the two inputs and the output is controlled to open/close by the combination of the levels of the two signals and, if necessary, a signal that indicates the standby mode, and having the function of selectively opening/closing between the output and input depending on the level of an input signal.

Further, according to the present invention, a circuit that always operates at a speed corresponding to the low threshold transistors is realized by employing the configuration that comprises a transmission system, using high threshold and low threshold transistors, where, when the input is at a high level, all the transistors that are turned on have low threshold values and all the transistors that are turned off have high threshold values, another transmission system where, when the input is at a low level, all the transistors that are turned on have low threshold values and all the transistors that are turned off have high threshold values (the two transmission systems have identical logic configuration), and a circuit with the function of selectively opening/closing the connection between the output and each transmission system at a later stage. In other words, in the present invention, it is possible to have a configuration where the transistors on the driven side in the transmission path from the input to output are always the low threshold ones.

Furthermore, according to the present invention, the subthreshold leakage during the standby mode can be suppressed to an amount corresponding to the high threshold transistors by employing the configuration where the high threshold transistors are provided between the low threshold transistors and power supplies for the two transmission systems. In the present invention, the high threshold transistors are turned off in one of the two transmission systems, between the side where the low threshold transistors are turned off and the power supply, the high threshold transistor is interposed, and by turning this off during the standby mode, the connection between the transmission system and power supply is turned off by the high threshold transistor, thereby suppressing the subthreshold leakage.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3 is a timing diagram showing an example of the operation of an embodiment of the present invention.

PREFERRED EMBODIMENTS OF THE INVENTION

Figure 1:
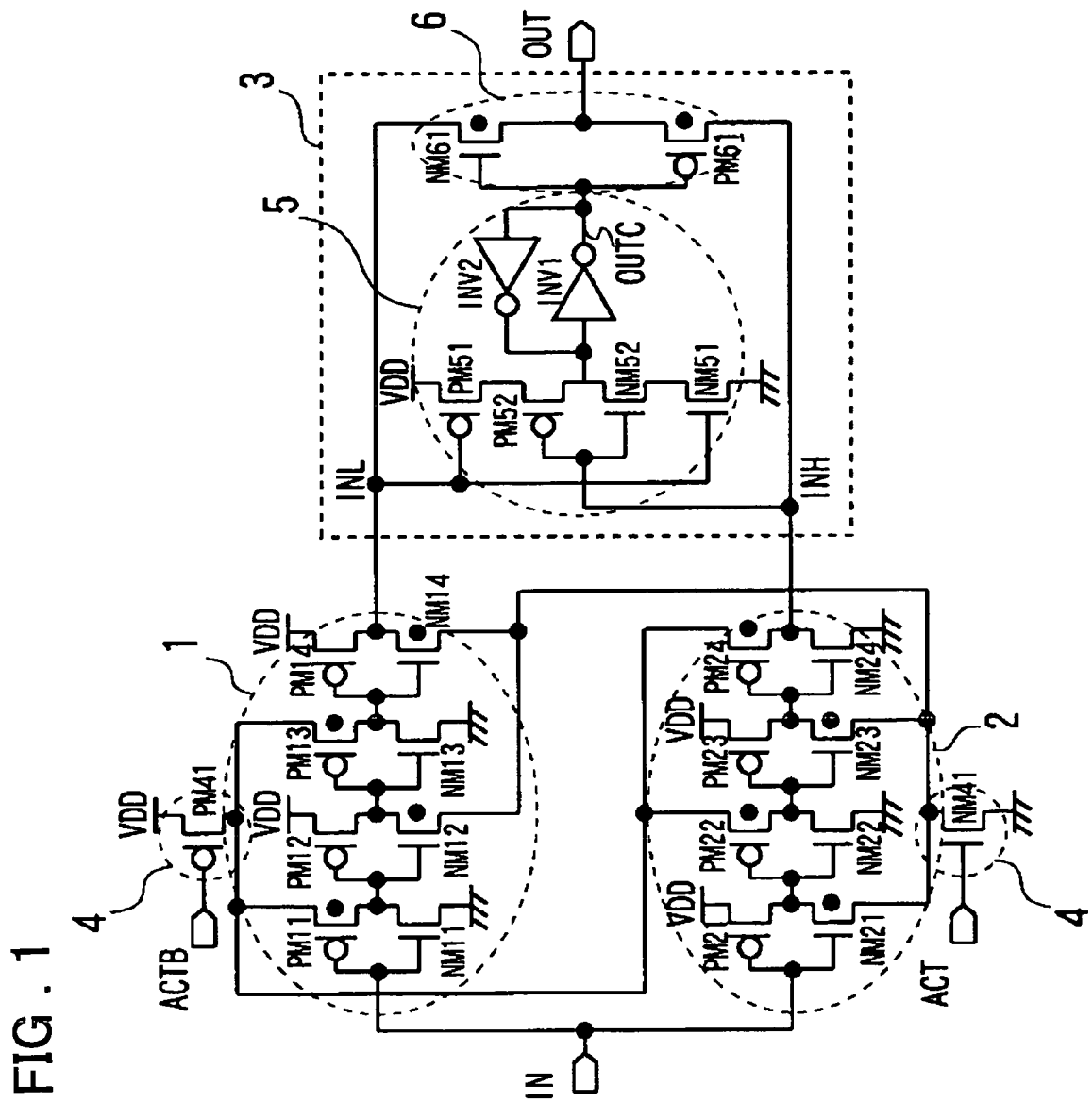
FIG. 1 is a diagram showing the circuit configuration of an embodiment of the present invention.

Preferred embodiments of the present invention will be described below. The operation principle of the present invention will be described. The semiconductor integrated circuit device according to the present invention includes first and second transmission systems with identical logic configurations but different threshold values for one input terminal (IN). In the first transmission system, a plurality of transistors that are turned off when an input is at a low level have high threshold values and a plurality of transistors that are turned on have low threshold values. In the second transmission system, a plurality of transistors that are turned off when an input is at a high level have high threshold values and a plurality of transistors that are turned on have low threshold values.

In the present invention, the first and second transmission systems are controlled to be turned off during a standby mode via a switch transistors (4) with high threshold values. For instance, between the transistors with low threshold values and power supplies, the transistors (4) with high threshold values are provided, and the transistors (4) are controlled to be turned on during an operation mode and off during the standby mode. During the operation mode, the first transmission system (1) propagates and outputs the falling transition (edge) of the input at high speed and the second transmission system (2) propagates and outputs the rising transition (edge) of the input at high speed.

In the present invention, behind the outputs of the first and second transmission systems (1 and 2), there is provided an output select unit (3). The output select unit (3) receives two signals (INL and INH), which have different transition speeds, from the first and second transmission systems (1 and 2), outputs a signal coming from the transmission system with a faster transition speed from an output terminal (OUT) using the open/close control function of output transistors provided in a transistor open/close unit (6), and performs control so that an output from the transmission system that outputs illegally is cut off during the standby mode.

In the present invention, a signal is selected out of the first and second transmission systems, in which the transistors driving the signal are ones with low threshold values and is output from the output terminal, thereby both signal transitions (from a high level to a low level and from a low level to a high level) being made to operate at a speed corresponding to the transistors with low threshold values.

In the present invention, the transistors with high threshold values are controlled to be turned off in one of the first and second transmission systems during the standby mode, and hence the subthreshold leakage is suppressed. Further, In the present invention, a transistor with a high threshold value (4) is provided between the transistors on the side where the low threshold transistors are turned off and the power supply and is controlled to be turned off during the standby mode, thereby suppressing the subthreshold leakage during the standby mode.

According to the present invention, during the operation mode, the output select unit (3) controls so that the transistor between an input signal that changes fast and an output interconnect (wiring) is turned on, and the connection between the transmission system with a slow changing signal and the output interconnect is turned off. This is controlled by two input signals and not by a delay from an output signal. Further, it is possible to automatically output a fast changing signal during the operation mode and output stably during the standby mode as well by controlling so that the connection between the input from a transmission system with possibilities of unstableness and inversion and the output terminal (OUT) is turned off, and the transistor between a stable input and the output terminal (OUT) is turned on during the standby mode. Hereinafter, more detailed description will be made with reference to embodiments.

FIG. 1 is a diagram showing the configuration of a first embodiment of the present invention. In FIG. 1, a reference numeral 1 designates a transmission system where an input IN changes at high speed when it changes from a high level to a low level, a reference numeral 2 designates a transmission system where the input IN changes at high speed when it changes from a low level to a high level, and 3 is an output select unit.

In the present embodiment, the transmission system 1 has a cascade-connected four-stage CMOS inverters. The first stage CMOS inverter comprises transistors PM11 and NM11, the second stage CMOS inverter comprises transistors PM12 and NM12, the third stage CMOS inverter comprises transistors PM13 and NM13, and the fourth stage CMOS inverter comprises PM14 and NM14. In the transmission system 1, transistors (PM11, NM12, PM13, and NM14) have threshold values low enough to meet speed demand (termed "low threshold transistors") and transistors (NM11, PM12, NM13, and PM14) have threshold values high enough to meet the demand of subthreshold (termed "high threshold transistors").

The transmission system 2 has a cascade-connected four-stage CMOS inverters. The first stage CMOS inverter comprises transistors PM21 and NM21, the second stage CMOS inverter comprises transistors PM22 and NM22, the third stage CMOS inverter comprises transistors PM23 and NM23 and the fourth stage CMOS inverter comprises transistors PM24 and NM24. In the transmission system 2, transistors (NM21, PM22, NM23, and PM24) have threshold values low enough to meet speed demand (termed "low threshold transistors") and transistors (PM21, NM22, PM23, and NM24) have threshold values high enough to meet the demand of subthreshold (termed "high threshold transistors").

The sources of the low threshold P-channel MOS transistors PM11 and PM13 in the first and third stage CMOS inverters in the transmission system 1 and the sources of the low threshold P-channel MOS transistors PM22 and PM24 in the second and fourth stage CMOS inverters in the transmission system 2 are connected in common. Between a high-level power supply VDD and the common connection node of the sources of transistors PM11, PM13, PM22 and PM24, there is provided a high threshold P-channel MOS transistor PM41 which has a gate connected to a control terminal ACTB (a complementary signal terminal to ACT) is connected.

The sources of the low threshold N-channel MOS transistors NM12 and NM14 in the second and fourth stages CMOS inverters in the transmission system 1 and the sources of the low threshold N-channel MOS transistors NM21 and NM23 in the first and third stages CMOS inverters in the transmission system 2 are connected in common. Between a low-level power supply GND and the common connection node of the sources of transistors NM12, NM14, NM21 and NM23, there is provided a high threshold N-channel MOS transistor NM41 that has a gate connected to a control terminal ACT is connected.

The transmission system 1 outputs the falling transition of the input IN from a high level to a low level from a node INL at high speed. The transmission system 2 outputs the rising transition of the input IN from a low level to a high level from a node INH at high speed.

The output select unit 3 comprises an open/close control signal generation unit 5 and a transistor open/close unit 6.

The open/close control signal generation unit 5 comprises a P-channel MOS transistor PM51 having a source thereof connected to a high-level power supply VDD and having a gate thereof connected to the output node INL of the transmission system 1, a P-channel MOS transistor PM52 having a source thereof connected to the drain of the P-channel MOS transistor PM51 and having a gate thereof connected to the output node INH of the transmission system 2, an N-channel MOS transistor NM52 having a drain thereof connected to the drain of the P-channel MOS transistor PM52 and having a gate thereof connected to INH, and an N-channel MOS transistor NM51 having a drain thereof connected to the source of the N-channel MOS transistor NM52, having a gate thereof connected to INL, and having a source thereof connected to a low-level power supply GND.

The open/close control signal generation unit 5 further comprises an inverter INV1 having an input end thereof connected to the coupled drains of the P-channel MOS transistor PM52 and the N-channel MOS transistor NM52, and an inverter INV2 having an input end thereof connected to an output end of the inverter INV1 and having an output end thereof connected to the input end of the inverter INV1. The two inverters INV1 and INV2 compose a flip-flop circuit, and the output end of the inverter INV1 constitutes an output node OUTC of the open/close control signal generation unit 5.

The transistor open/close unit 6 comprises an N-channel MOS transistor NM61 having a drain thereof connected to INL and having a gate thereof connected to the OUTC, a P-channel MOS transistor PM61 having a source thereof connected to INH, having a gate thereof connected to the OUTC, and having a drain thereof connected to the drain of the N-channel MOS transistor NM61 and to an output terminal OUT.

The transmission system 1 is configured such that the low threshold transistors (PM11, NM12, PM13, and NM14) are turned on when the input IN changes from a high level to a low level. The transmission system 2 is configured such that the low threshold transistors (NM21, PM22, NM23, and PM24) are turned on when the input IN changes from a low level to a high level. The transmission systems 1 and 2 have the same configuration except how the direction of transition affects their current driving capabilities.

Further, for the sake of simplicity, each of the transmission systems 1 and 2 is comprised of a cascade-connected four-stage CMOS inverters in FIG. 1, however, as long as the above-mentioned conditions regarding threshold values are met, the circuit configuration is not limited to a CMOS inverter and an optional circuit can be used.

Figure 2A:
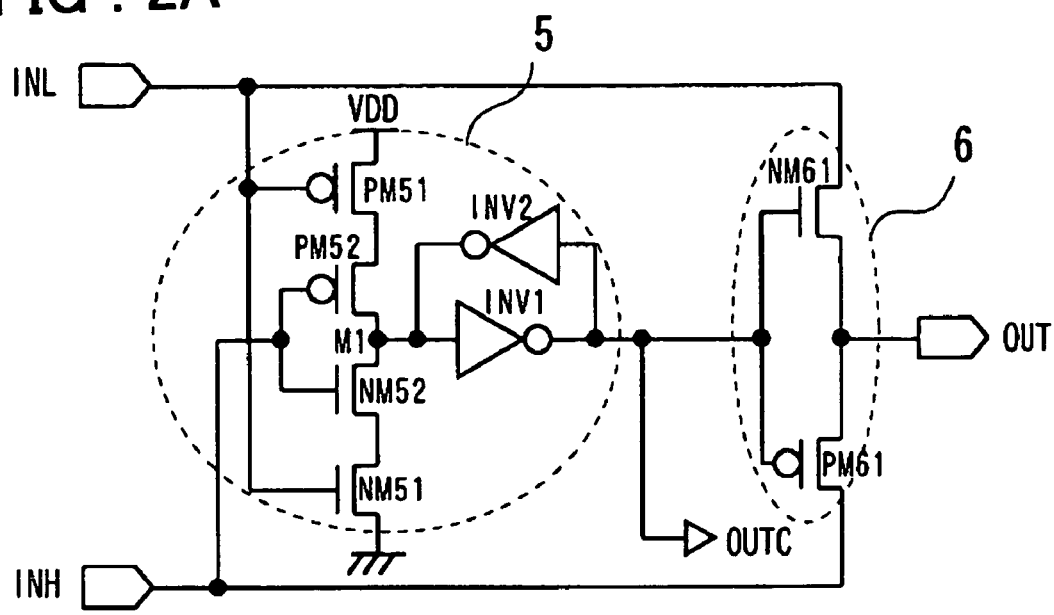
FIGS. 2A and 2B are diagrams showing the circuit configurations of the output select unit 3 of an embodiment of the present invention.

The output select unit 3 in FIG. 1 is partially extracted and shown in FIG. 2A. The input INL, the output node of the transmission system 1, is an input where a signal changes from a high level to a low level at high speed, and the input INH, the output node of the transmission system 2 is an input where a signal changes from a low level to a high level at high speed. In the open/close control signal generation unit 5, four elements (the P-channel MOS transistor PM51 having a gate thereof connected to the input INL, the P-channel MOS transistor PM52 having a gate thereof connected to the input INH, the N-channel MOS transistor NM51 having a gate thereof connected to the input INL, and the N-channel MOS transistor NM52 having a gate thereof connected to the input INH) are connected in series between the power supplies VDD and GND, the drains of the P-channel MOS transistor PM52 and the N-channel MOS transistor NM52 are connected to each other and then to the input end of the inverter INV1, and the output end of the inverter INV1 (OUTC) is connected to the transistor open/close unit 6.

When INL and INH are at the same level, the open/close control signal generation unit 5 outputs the signal to the OUTC at this level, and when they are at different levels, the node M1 is set into a floating state and temporarily holds the level immediately before.

In other words, when INL and INH are both at a low level, the P-channel MOS transistors PM51 and PM 52 are turned on, the N-channel MOS transistors NM51 and NM52 are turned off, an output node M1 goes to a high level, and the OUTC is at a low level.

On the other hand, when INL and INH are both at a high level, the P-channel MOS transistors PM51 and PM 52 are turned off, the N-channel MOS transistors NM51 and NM52 are turned on, the output node M1 goes to a low level, and the OUTC is at a high level.

When INL is at a low level and INH is at a high level, the P-channel MOS transistor PM51 is turned on while the PM52 is turned off, the N-channel MOS transistor NM52 is turned on while the N-channel MOS transistor NM51 is turned off, and the output node M1 is in a floating state. At this time, in the case where the OUTC is at a high level immediately before, the output of the inverter INV2 is at a low level, the node M1 in a floating state is set to a low level by the inverter INV2, and the node OUTC, which outputs an inverted signal by the inverter INV1, holds a high level. On the other hand, in the case where the OUTC is at a low level immediately before, the output of the inverter INV2 is at a high level, the node M1 in a floating state is pulled up to a high level, and as a result, the output node OUTC holds a low level.

When INL is at a high level and INH is at a low level, the P-channel MOS transistor PM51 is turned off while the PM52 is turned on, the N-channel MOS transistor NM52 is turned off while the NM51 is turned on, and the output node M1 is in a floating state. At this time, in the case where the OUTC is at a high level immediately before, the output of the inverter INV2 is at a low level, the node M1 in a floating state is set to a low level, and the node OUTC, which outputs an inverted signal by the inverter INV1, holds a high level. In the case where the OUTC is at a low level immediately before, the output of the inverter INV2 is at a high level, the node M1 in a floating state is pulled up to a high level, and the output node OUTC holds a low level.

In the present invention, a signal OUTC is used to control the transistors PM61 and NM61 of the transistor open/close unit 6 as necessary while driving and latching.

In the transistor open/close unit 6, when the output signal OUTC from the open/close control signal generation unit 5 is at a high level, the N-channel MOS transistor NM61 is turned on, the P-channel MOS transistor PM61 is turned off, and the input INL is connected to the output terminal OUT. Further, in the transistor open/close unit 6, when the output signal OUTC from the open/close control signal generation unit 5 is at a low level, the N-channel MOS transistor NM61 is turned off, the P-channel MOS transistor PM61 is turned on, and the input INL is connected to the output terminal OUT.

Figure 2B:
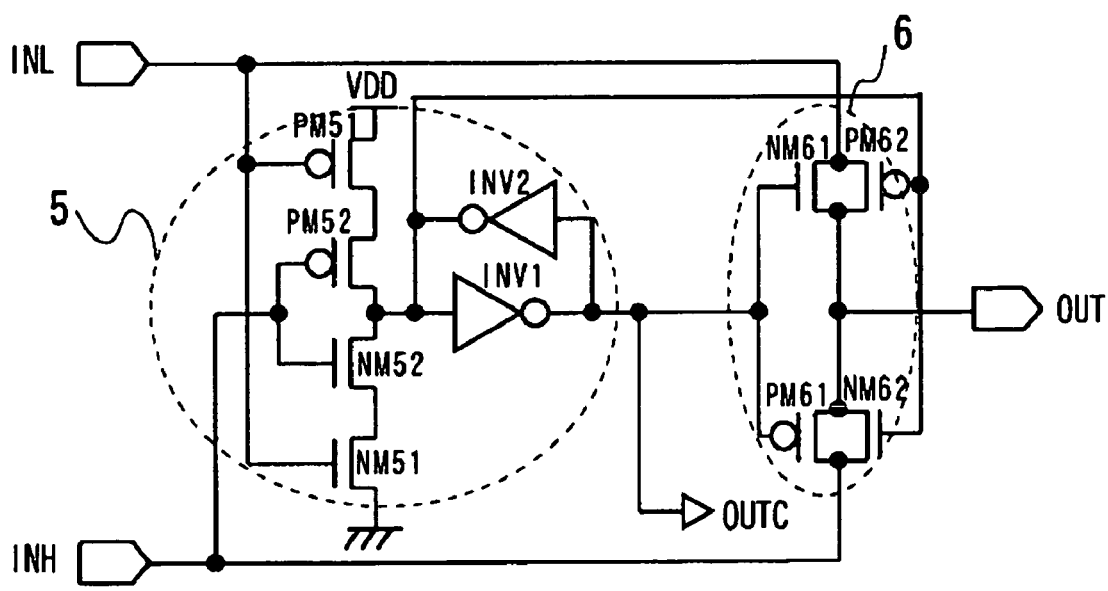

Furthermore, as shown in FIG. 2B, it can have a configuration where a P-channel type transistor PM62 is provided parallel to the N-channel MOS transistor NM61 between INL and the output terminal OUT, an N-channel MOS transistor NM62 is provided parallel to the P-channel type transistor PM61 between INH and the output terminal OUT, and an inverted signal of the signal OUTC is supplied to the gates of these two transistors PM62 and NM62. In the configuration shown in FIG. 2B, a full-range output between the high-level power supply VDD and low-level power supply GND is made possible by providing a CMOS transfer gate between INL and the OUT, and INH and the OUT respectively.

FIG. 3 is a timing diagram showing an example of the operation of the present embodiment shown in FIG. 1. In FIG. 3, waveforms of ACT, ACTB, IN, INL, INH, OUTC, and OUT in FIG. 1 are shown. The operation of the present embodiment will be described with reference to FIGS. 1 and 3. During the operation mode, the signal ACT is at a high level and ACTB is at a low level, and during the standby mode, the signal ACT is at a low level and the signal ACTB is at a high level.

First, explanations on a period (a) in FIG. 3 will be made. During the rising transition of the input IN from a low level to a high level, the output node INH of the transmission system 2 rises faster than the output node INL of the transmission system 1. In other words, corresponding to the transition of the input IN from a low level to a high level, INH rises to a high level before INL does, and the rising edge of INL is later than the rising edge of INH. In the example shown in FIG. 3, the input IN, INL, and INH have the same phase.

In an early state, when IN is at a low level, INL and INH are at a low level, and the control signal OUTC from the open/close control signal generation unit 5 is at a low level in the early state. In the transistor open/close unit 6, when the signal OUTC is at a low level, the P-channel MOS transistor PM61 is turned on and outputs a signal of INH from the output terminal OUT, and when the signal OUTC is at a high level, the N-channel MOS transistor NM61 is turned on and outputs a signal from INH from the output terminal OUT. In the early state, since the signal OUTC is at a low level, the waveform of INH is outputted from the output terminal OUT.

Even if INH changes to a high level from a low level, the signal OUTC will keep the level immediately before and stay at a low level since the values of INL and INH are different.

When INL changes to a high level from a low level after INH does, INL and INH are both at a high level and the signal OUTC goes to a high level. Therefore, during the period (a) in FIG. 3 from when IN is at a low level in the early state until INL goes to a high level, the signal OUTC is at a low level and a signal of INH is outputted from the output terminal OUT.

During the period (a) in FIG. 3, the output terminal OUT varies its signal corresponding to INH, and when INH changes to a high level from a low level, the output terminal OUT rises to a high level from a low level.

When INL rise to a high level from a low level later, the output terminal OUT is supposed to output the level of INL, however, the output terminal OUT keeps outputting a high level since INL is already at a high level.

On the other hand, when the input IN changes to a low level from a high level, INL falls to a low level from a high level faster than INH does. In other words, the timing of the falling transition of INL is faster than that of INH.

During a period (b) from when INH and INL both go at a high level until INH changes to a low level from a high level, the output terminal OUTC outputs a high level.

Since the output terminal OUT outputs a signal from INL during the period (b), it falls to a low level from a high level when INL changes to a low level from a high level.

When INH goes to a low level and as a result, so does the signal OUTC, the output terminal OUT is supposed to output a signal from INH, however, it stays at a low level since INH is already at a low level.

Therefore, during the operation mode, the circuit shown in FIG. 1 always outputs a signal corresponding to the speed of the transmission system where a signal is changed at high speed.

Next, the circuit operation of the present embodiment, during the standby mode, will be described with reference to FIGS. 1 and 3.

When entering into the standby mode, the signal ACT is set to a low level and its complementary signal ACTB is set to a high level. As a result, the transistors PM41 and NM41 are both turned off, the connection between the low threshold P-channel MOS transistors of the transmission systems 1 and 2 (PM11, PM13, PM22, and PM24) and the power supply VDD becomes an off-state, and the connection between the low threshold N-channel MOS transistors of the transmission systems 1 and 2 (NM12, NM14, NM21, and NM23) and the power supply GND becomes an off-state. At this time, the connections between the transistors turned off and the power supplies VDD and GND are turned off by the high threshold transistors PM41 and NM41, and the sub-threshold leakage is suppressed to an amount corresponding to the high threshold transistors.

In this case, the connection between the transistor turned on and the power supplies VDD and GND is turned off in one of the transmission systems 1 or 2, and an output from that transmission system becomes unstable.

However, in the present embodiment, since the connection between the unstable output and the output terminal OUT is turned off in the output select unit 6, a stable level is outputted at the final stage. Using the waveforms in FIG. 3 as examples, during a period (c), the output INL from the transmission system 1, where the low threshold transistors PM11, NM12, PM13, and NM14 are turned on, becomes unstable because IN is at a low level. ACT is at a low level, and ACTB is at a high level. During the period (c), IN is at a low level, the connection between the source of the P-channel MOS transistor PM11 and the power supply VDD and the connection between the source of the N-channel MOS transistor NM14 and the GND are both cut off, and INL becomes unstable.

On the other hand, the P-channel MOS transistor PM21 of the transmission system 2 is turned on and its drain becomes the power supply potential VDD, the second stage N-channel MOS transistor NM22, having a source thereof grounded, is turned on and its drain potential becomes the ground potential, the third stage P-channel MOS transistor PM23 is turned on and its drain potential becomes the power supply potential VDD, the N-channel MOS transistor NM24, whose source is grounded, is turned on, INH is goes to a low level, and a fixed logic level is outputted.

And before INL becomes unstable, INL and INH are both at a low level, and the output OUTC of the open/close control signal generation unit 5 goes to a low level.

The open/close control signal generation unit 5 does not output an inverted logic level of the time before entering into the standby mode even in a floating state when either INL or INH becomes unstable (INL is unstable in FIG. 1) if the other (INH in FIG. 1) is stable.

Therefore, during the standby mode, the transistor open/close unit 6 always outputs INH from the output terminal OUT by fixing the signal OUTC with a latch for instance (a flip-flop circuit is used in FIG. 1) and inputting the low level OUTC into the transistors NM61 and PM61 as shown in the example in FIG. 1. Because of this, no problem will occur even if INL becomes unstable. Therefore, the transistor open/close unit 6 does not output illegally during the standby mode and the subthreshold leakage can be suppressed.

Figure 4:
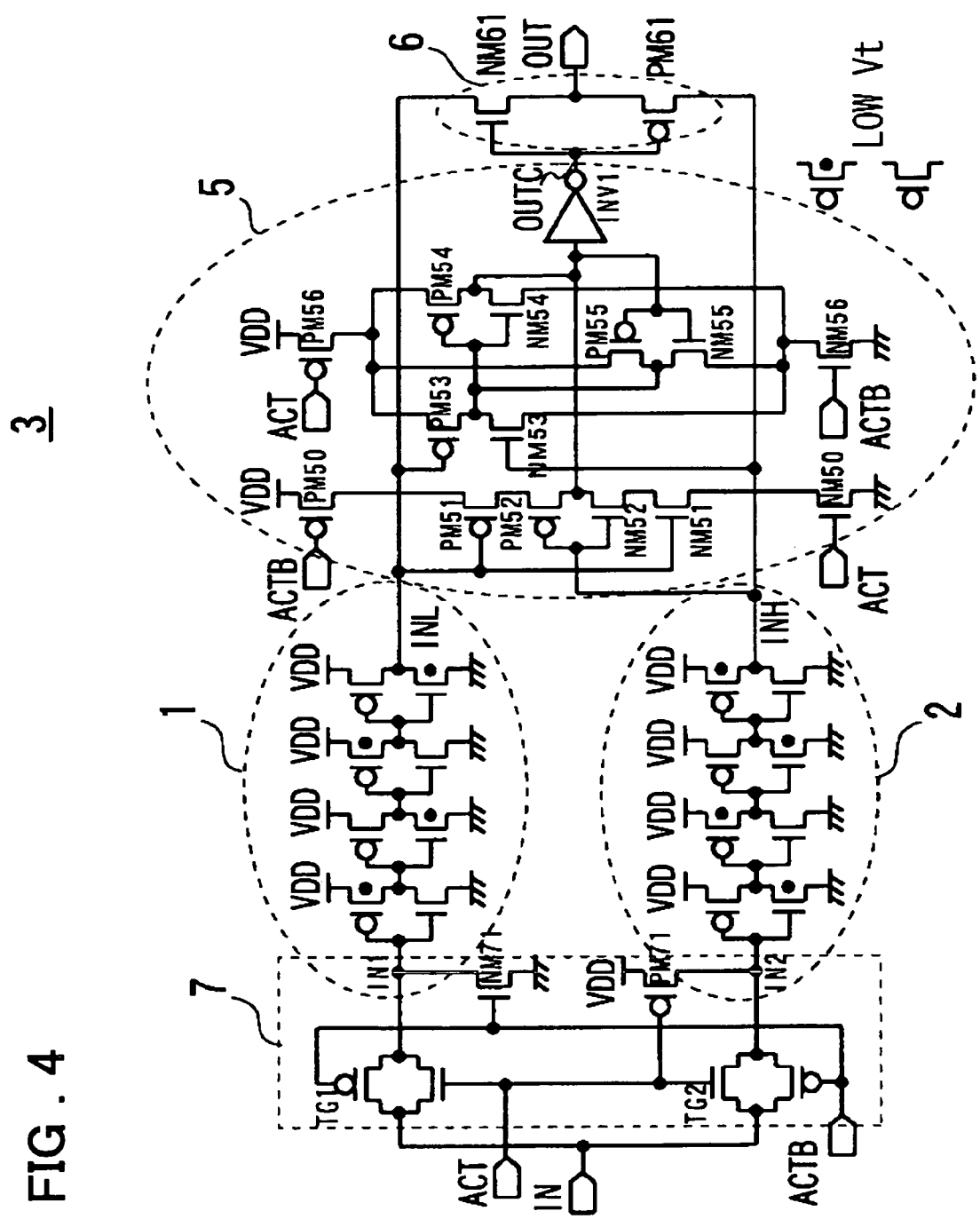
FIG. 4 is a diagram showing the circuit configuration of another embodiment of the present invention.

Next, another embodiment of the present invention will be described in detail with reference to the diagrams. FIG. 4 is a diagram showing the whole configuration of the second embodiment of the present invention. While the subthreshold leakage is suppressed in the configuration of the first embodiment shown in FIG. 1 by turning off the connection between the low threshold transistors (PM11, PM13, PM22, and PM24) and the power supply VDD with the high threshold transistor PM41 and turning off the connection between the low threshold transistors (NM12, NM14, NM21, and NM23) and the power supply GND with the high threshold transistor NM41 during the standby mode, in the present embodiment, the subthreshold leakage is suppressed by setting the input level of each transmission system to a value where the side of the high threshold transistors will be turned off in each transmission system during the standby mode.

At this time, since the level of one of the transmission systems is inverted, the input from the transmission system where the level is inverted is cut off and the input from the transmission system where the level is not inverted is outputted.

Therefore, instead of the cut-off transistors PM41 and NM41 provided in the first embodiment, a reset unit 7 is provided in the present embodiment.

In FIG. 4, two transmission systems 1 and 2 are constituted by cascade-connecting four stages of CMOS inverters where the conductivity types of low threshold and high threshold transistors are switched between the odd-numbered stages and even-numbered stages. However, unlike the first embodiment, the cut-off transistors PM41 and NM41 are not provided between the sources of the low threshold P-channel MOS transistors (PM11, PM13, PM22, and PM24) connected in common and the power supply VDD and between the sources of the low threshold N-channel MOS transistors (NM12, NM14, NM21, and NM23) connected in common and the GND in the present embodiment, and the low threshold transistors are directly connected to the corresponding power supplies VDD and GND.

The reset unit 7 comprises a CMOS transfer gate TG1, which ACT turns on at a high level and is connected between an input IN and an input IN1 of the transmission system 1, and a CMOS transfer gate TG2, which ACT turns on at a high level and is connected between the input IN and an input IN2 of the transmission system 2, and also comprises an N-channel MOS transistor NM71 having a gate thereof connected to ACTB between the input IN1 and a low-level power supply GND, and a P-channel MOS transistor PM71 having a gate thereof connected to ACT between the input IN2 and a high-level power supply VDD. ACT is at a low level, the potential of IN2 is equal to the high-level power supply potential VDD, and the potential of IN1 is equal to the low-level power supply potential GND. The N-channel MOS transistor NM71 and P-channel MOS transistor PM71 fix the levels of IN1 and IN2 when the CMOS transfer gates TG1 and TG2 are turned off at a low level and high level respectively.

The configuration of the reset 7 is not limited to the above and any optional circuit configuration that can reset can be used. For instance, a configuration where logic gates such as NAND and NOR are used to reset IN1 and IN2 can be employed.

The output select unit 3 needs to switch the open/close of the transistors during the standby mode since the unstable input comes from the opposite transmission system to the one in the first embodiment during the standby mode. Because of this, it comprises a circuit that inverts the open/close control signal during the standby mode.

An open/close control signal generation unit 5 comprises a P-channel MOS transistor PM50 having a source thereof connected to a high-level power supply VDD and having a gate thereof connected to a terminal ACTB, a P-channel MOS transistor PM51 having a source thereof connected to the drain of the P-channel MOS transistor PM50 and having a gate thereof connected to an INL (an output node of the transmission system 1), a P-channel MOS transistor PM52 having a source thereof connected to the drain of the P-channel MOS transistor PM51 and having a gate thereof connected to an INH (an output node of the transmission system 2), an N-channel MOS transistor NM52 having a drain thereof connected to the drain of the P-channel MOS transistor PM52 and having a gate thereof connected to INH, an N-channel MOS transistor NM51 having a drain thereof connected to the source of the N-channel MOS transistor NM52 and having a gate thereof connected to INL, and an N-channel MOS transistor NM50 having a drain thereof connected to the source of the N-channel MOS transistor NM51 and having a gate thereof connected to ACT.

Further, the open/close control signal generation unit 5 comprises a P-channel MOS transistor PM56 having a source thereof connected to a high-level power supply VDD and having a gate thereof connected to a terminal ACT, a P-channel MOS transistor PM53 having a source thereof connected to the drain of the P-channel MOS transistor PM56 and having a gate thereof connected to INL, an N-channel MOS transistor NM53 having a drain thereof connected to the drain of the P-channel MOS transistor PM53 and having a gate thereof connected to INH, a P-channel MOS transistor PM54 having a source thereof connected to the drain of the P-channel MOS transistor PM56 and having a gate thereof connected to the common drain of the transistors PM53 and NM53, an N-channel MOS transistor NM54 having a drain thereof connected to the drain of the P-channel MOS transistor PM54 and having a gate thereof connected to the common drain of the transistors PM53 and NM53, a P-channel MOS transistor PM55 having a source thereof connected to the drain of the P-channel MOS transistor PM56 and having a gate thereof connected to the common drain of the transistors PM54, NM54, PM52, and NM52, an N-channel MOS transistor NM55 having a drain thereof connected to the drain of the P-channel MOS transistor PM55 and having a gate thereof connected to the common drain of the transistors PM54, NM54, PM52, and NM52, and an N-channel MOS transistor NM56 having a drain thereof connected to the common source of the N-channel MOS transistors NM53, NM54, and NM55, having a gate thereof connected to a terminal ACTB, and having a source thereof connected to a low-level power supply GND, and it also comprises an inverter INV1 whose input is the common drains of the transistors PM54 and NM54, and PM52 and NM52. The transistors PM53 and NM53, PM54 and NM54, and PM55 and NM55 constitute inverters, and an input end and output end of the PM54 and NM54, and PM55 and NM55 are respectively connected and they constitute flip-flop circuits.

During the operation mode, a signal ACT is at a high level, a signal ACTB is at a low level, the P-channel MOS transistor PM50 and N-channel MOS transistor NM50 are both turned on, and the P-channel MOS transistor PM56 and N-channel MOS transistor NM56 are turned off.

When INL and INH are both at a low level, a high level is outputted from the common drain node of the transistors PM52 and NM52, and an output signal OUTC of the inverter INV1 goes to a low level. At this time, the P-channel MOS transistor PM61 is turned on, and a signal of INH is outputted from an output terminal OUT.

When INL and INH are both at a high level, a low level is outputted from the common drain node of the transistors PM52 and NM52, and the output signal OUTC of the inverter INV1 goes to a high level. At this time, the N-channel MOS transistor NM61 is turned on, and a signal of INL is outputted from the output terminal OUT.

Further, when INL and INH are at different levels, the common drain node of the transistors PM52 and NM52 is in a floating state. At this time, the output OUTC of the inverter INV1, to whose input end the common drain node of the transistors PM52 and NM52 is connected, keeps the value immediately before for a while.

On the other hand, during the standby mode, ACT is at a low level, ACTB is at a high level, and the reset circuit 7 resets the input IN1 of the transmission system 1 to a low level and the input IN2 of the transmission system 2 to a high level. Therefore, from IN1 and IN2, INL and INH are at a low level and a high level respectively.

Also, during the standby mode, the P-channel MOS transistor PM50 and the N-channel MOS transistor NM50 are both turned off, and the common drain node of the transistors PM52 and NM52 is in a floating state. On the other hand, the P-channel MOS transistor PM56 and the N-channel MOS transistor NM56 are both turned on.

And, when INL and INH are both at a low level during the standby mode when ACT is at a low level and ACTB is at a high level, the P-channel MOS transistor PM53 is turned on, the N-channel MOS transistor NM53 is turned off, and the common drain of the transistors PM54 and NM54 is at a low level. At this time, the output signal OUTC of the inverter INV1 is at a high level, the N-channel MOS transistor NM61 is turned on, and the signal from INL is outputted.

And when INL and INH go to a low level and a high level respectively as a result of resetting IN1 and IN2, the P-channel MOS transistor PM53 and N-channel MOS transistor NM53 are both turned on. The level of the inverter (PM55 and NM55) is at a low level immediately before this, the P-channel MOS transistor PM54 is turned on, the divided voltage due to the on-resistances of the on-state P-channel MOS transistors PM53 and PM54 and the on-state N-channel MOS transistor NM53 is higher than the threshold voltage of the inverter (PM54 and NM54), the inverter (PM54 and NM54) outputs a low level, the input end of the inverter INV1 is kept at a low level, and the output signal OUTC of the inverter INV1 is kept at a high level. Therefore, the N-channel MOS transistor NM61 is kept in an on-state, and a signal of INL is outputted from the output terminal OUT.

Further, during the standby mode, that is, when ACT is at a low level and ACTB is at a high level, if INL and INH are both at a high level, the P-channel MOS transistor PM53 is turned off, the N-channel MOS transistor NM53 is turned on, and the commonly coupled drains of the transistors PM54 and NM54 are at a high level. At this time, the output signal OUTC of the inverter INV1 is at a low level. As a result, the P-channel MOS transistor NM61 into whose gate OUTC is supplied is turned on, and a signal of INH is outputted from the output terminal OUT. And when INL and INH go to a low level and a high level respectively as a result of resetting IN1 and IN2, the P-channel MOS transistor PM53 and N-channel MOS transistor NM53 are both turned on, however, the level of the inverter (PM55 and NM55) is at a high level immediately before this, the N-channel MOS transistor NM54 is turned on, the divided voltage due to the on-resistances of the on-state P-channel MOS transistor PM53 and the on-state N-channel MOS transistors NM53 and NM55 is lower than the threshold voltage of the inverter (PM54 and NM54), the inverter (PM54 and NM54) outputs a high level, the input end of the inverter INV1 is kept at a high level, and the output signal OUTC of the inverter INV1 is kept at a low level. As a result, the output signal OUTC of the inverter INV1 is kept at a low level, the P-channel MOS transistor PM61 is kept in an on-state, and a signal of INH is outputted from the output terminal OUT.

Figure 5:
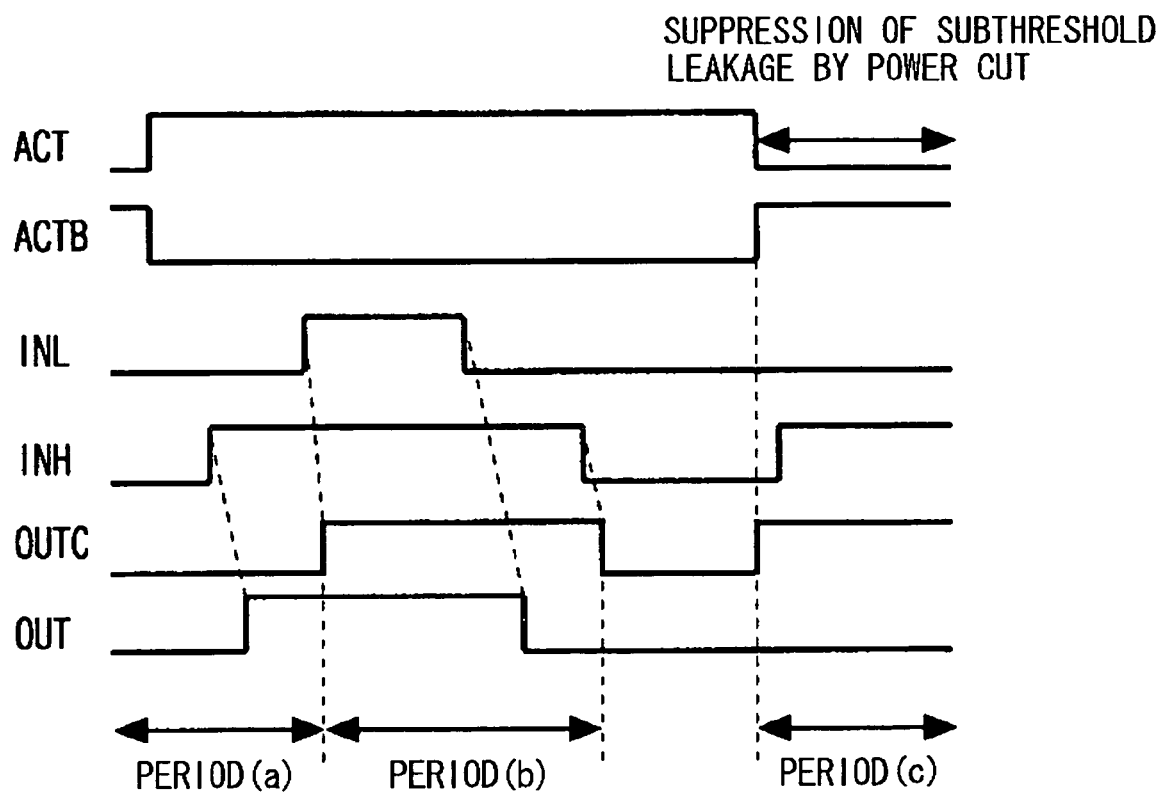
FIG. 5 is a timing diagram showing an example of the operation of another embodiment of the present invention.

FIG. 5 is a timing diagram showing an example of the operation of the second embodiment shown in FIG. 4. The operation of the second embodiment of the present invention will be described with reference to FIGS. 4 and 5. Since the operation during the operation mode when the signal ACT is at a high level (periods (a) and (b) in FIG. 5) is the same as that of the first embodiment described with reference to FIG. 3 (the periods (a) and (b) in FIG. 3), the operation during the standby mode will be described hereinafter.

The standby mode starts when INL and INH are both at a low level, shown as a period (c) in FIG. 5. When entering into the standby mode, the signal ACT goes to a low level and the signal ACTB goes to a high level, and as a result, the output OUTC from the open/close control signal generation unit 5 is inverted and the output signal OUTC of the inverter INV1 changes to a high level from a low level.

As a result, in the transistor open/close unit 6, the N-channel MOS transistor NM61 is turned on and the P-channel MOS transistor PM61 is turned off and hence INL is connected to the output terminal OUT and INH is disconnected from the output terminal OUT. In other words, a signal of INL is outputted from the output terminal OUT.

Furthermore, when the signal ACT goes to a low level and the signal ACTB goes to a high level, the transistors NM71 and PM71 are turned on in the reset unit 7, INL is reset to a low level in the transmission system 1, while INH is reset to a high level in the transmission system 2, as a result of which, the high threshold transistors are turned off in all the paths and the subthreshold leakage is suppressed.

By resetting, the level of INL is kept at a low level, and the level of INH is inverted to a high level. However, since the output select unit 3 outputs INL in the present embodiment, the level of the output terminal OUT is kept at a low level.

At the time of entering into the standby mode from the operation mode, under the condition of INL and INH both being at a high level, the reset circuit 7 starts to operate to make INL inverted to a low level. However, the output select unit 3 controls so that a signal of INH is outputted from the output terminal OUT in this case as well.

Figure 6:
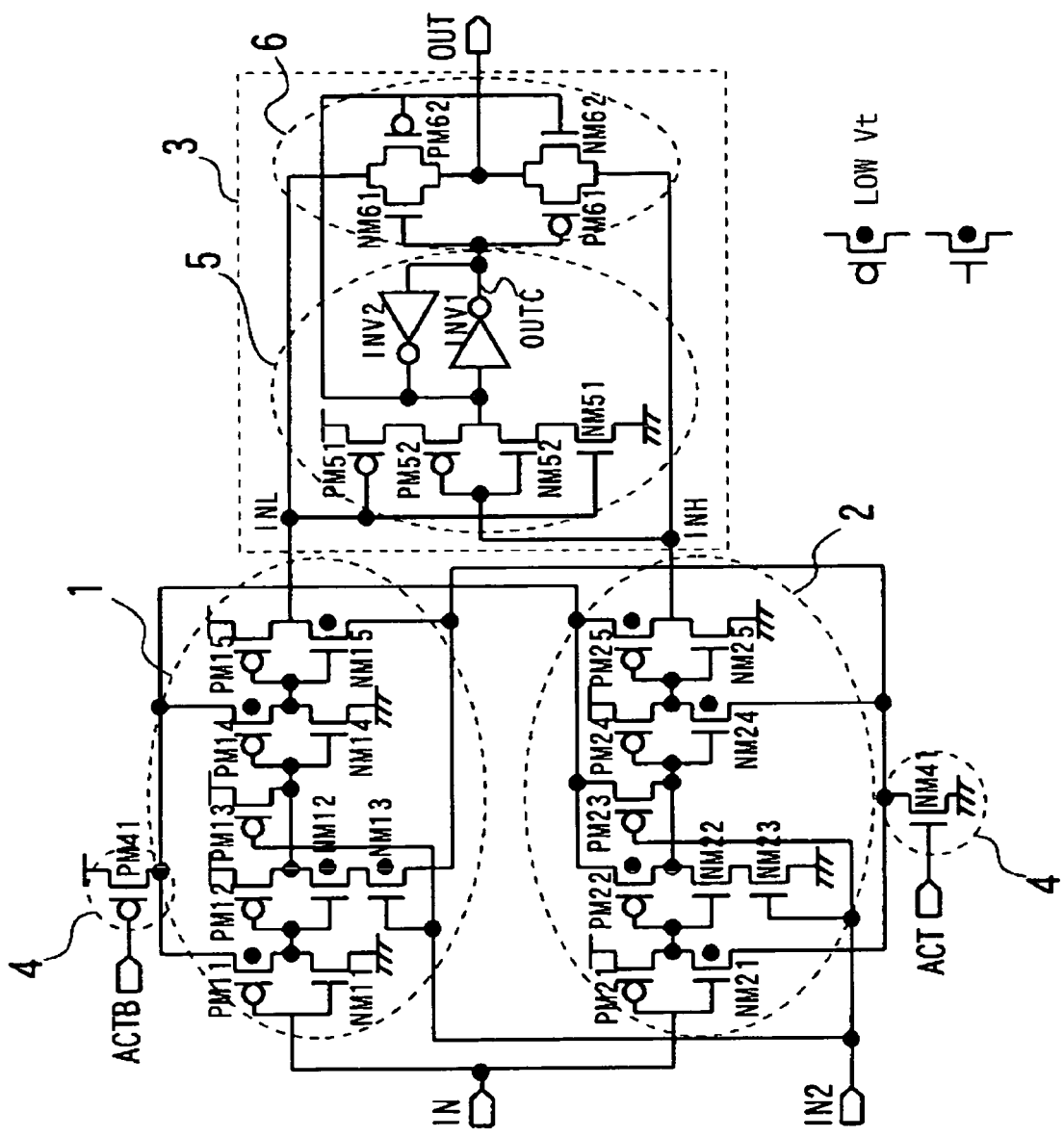
FIG. 6 is a diagram showing the circuit configuration of yet another embodiment of the present invention.
Figure 7:
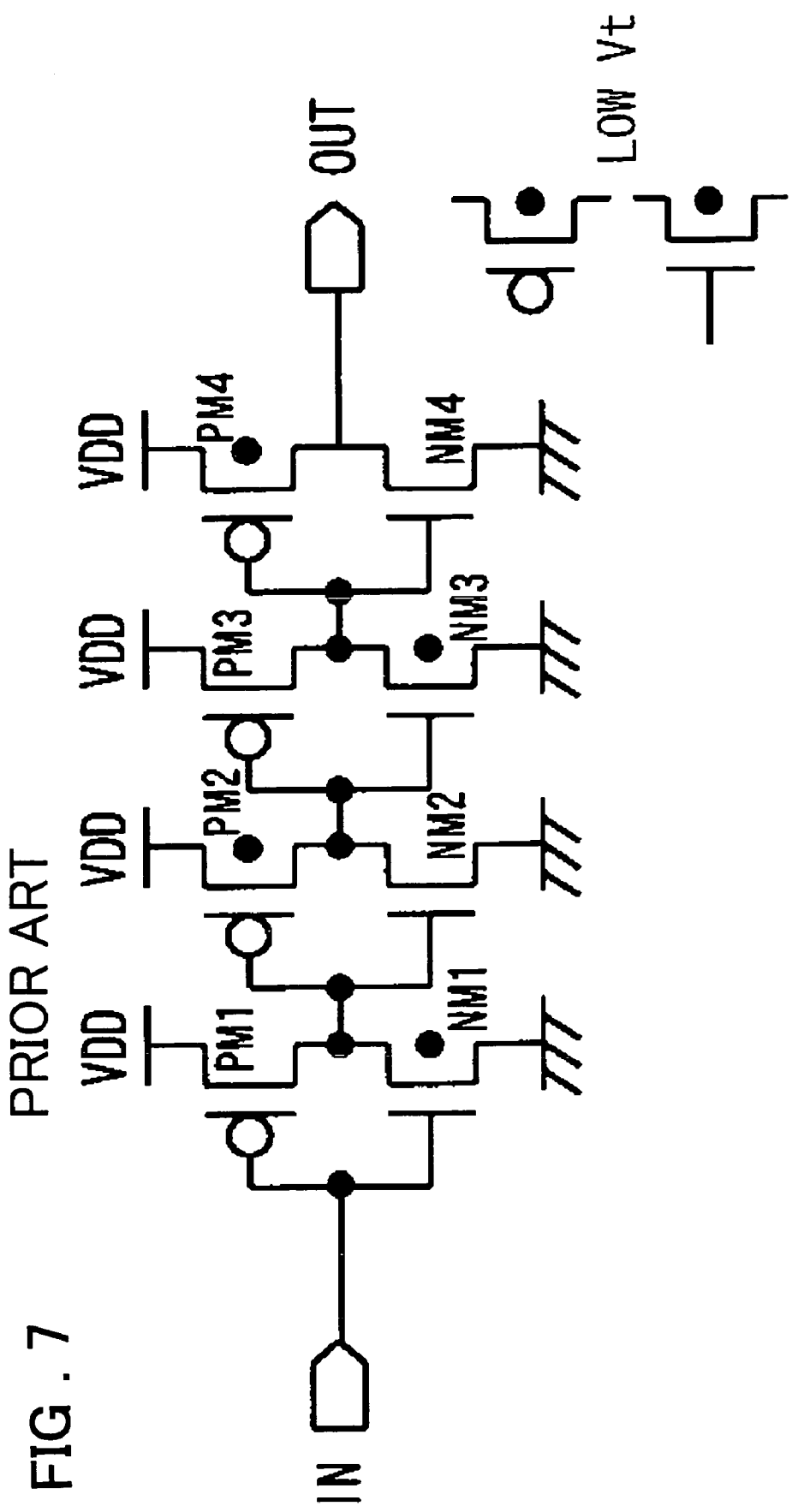
FIG. 7 is a diagram showing the circuit configuration of the conventional technology (Patent Document 1).
Figure 8:
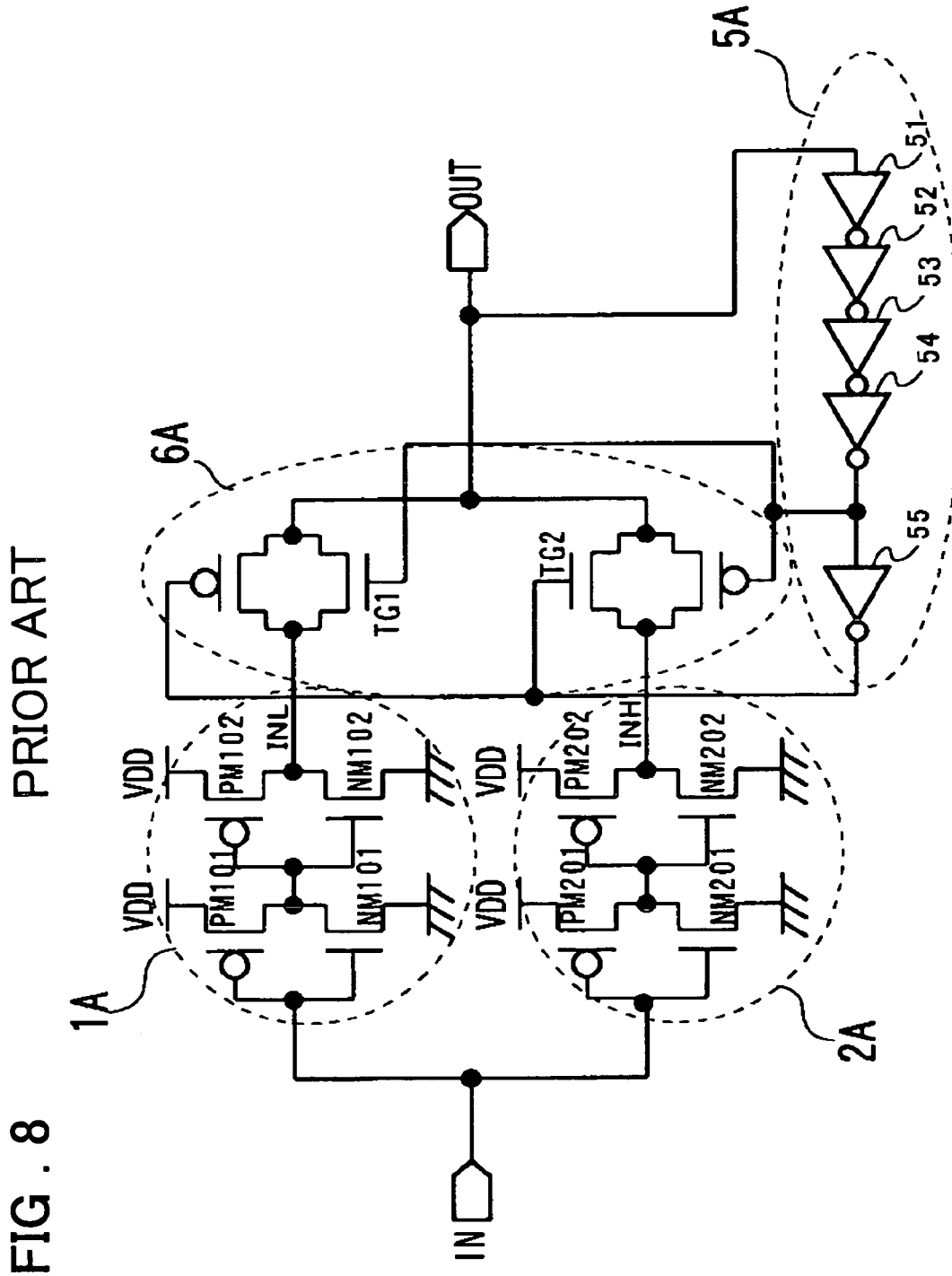
FIG. 8 is a diagram showing the circuit configuration of the conventional technology (Patent Document 2).
Figure 9:
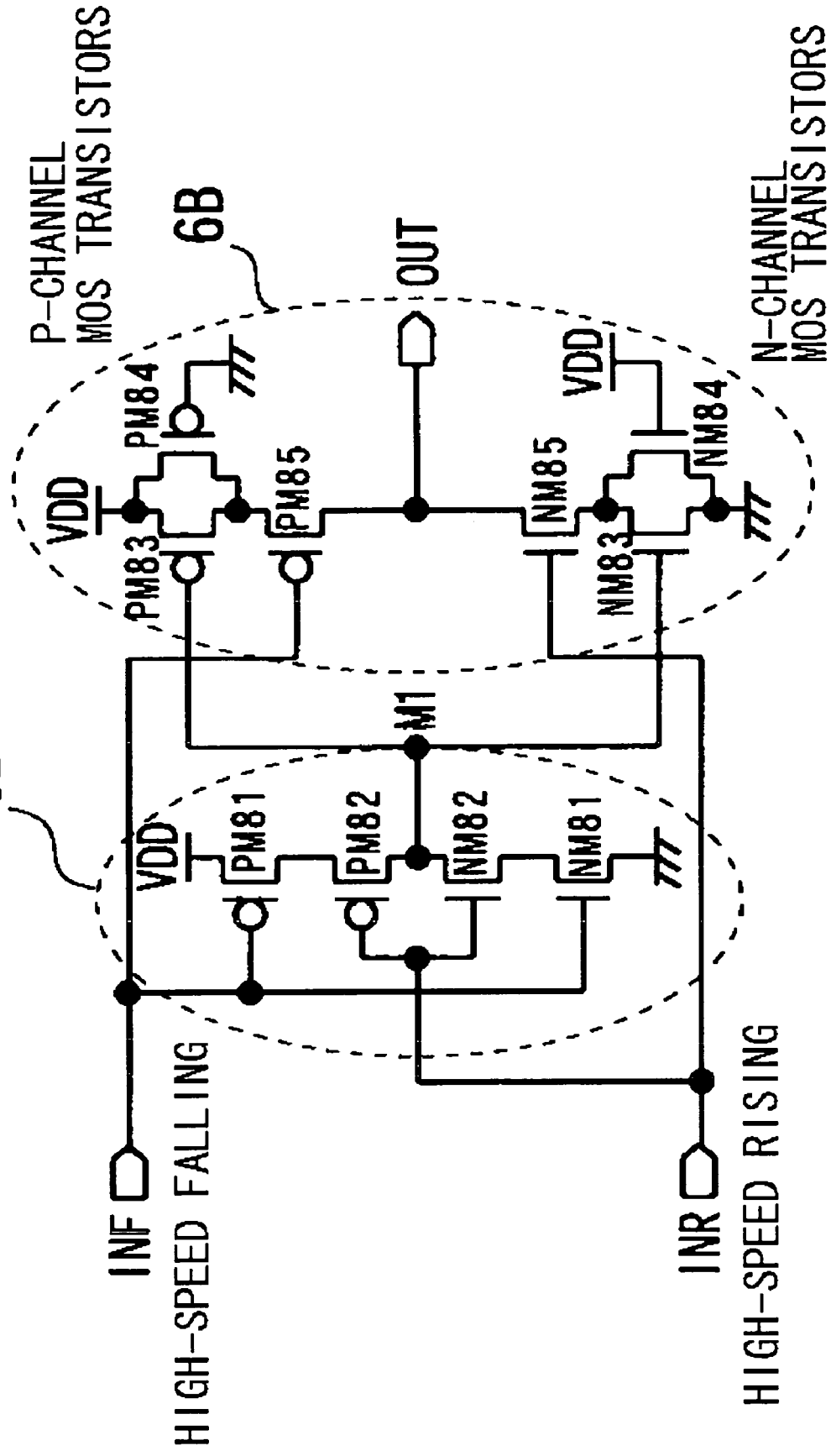
FIG. 9 is a diagram showing the circuit configuration of the conventional technology (Patent Document 3).

FIG. 6 is a diagram showing an example of the embodiment of the present invention. Two transmission systems 1 and 2 are provided for an input IN. The transmission systems 1 and 2 have the same logical configuration, which is as follows in this example: inverters (PM11 and NM11), and (PM21 and NM21); NANDs (PM12, PM13, NM12, and NM13) and (PM22, PM23, NM22, and NM23); inverters (PM14 and NM14) and (PM24 and NM24); inverters (PM15 and NM15) and (PM25 and NM25).

The transistors in the transmission systems 1 and 2 have different capabilities; in the transmission system 1, from left (IN) to right, low threshold transistors are provided alternately between the VDD and GND sides, starting with the VDD side, and the transistors provided oppositely to them have high threshold values. The low threshold values are low enough to meet the speed demand, and the high threshold values are high enough to suppress the subthreshold leakage during an off-state to an acceptable amount.

In the transmission system 2, from left (IN) to right, low threshold transistors are provided alternately between the GND and VDD sides, starting with the GND side, and the transistors provided oppositely to them have high threshold values.

The sources of the low threshold transistors are not directly connected to the power supplies VDD and GND, but connected to a virtual power supply line. Between the virtual power supply line and the power supplies, there are provided transistors PM41 and NM41 with high threshold values, having gates connected to ACTB and ACT respectively. The transistors PM41 and NM41 are turned off during the standby mode (when ACT is at a low level). Outputs from the two transmission systems 1 and 2 are supplied to an output select circuit 3 at a later stage.

The output select circuit 3 has two inputs and one output, and transfer gates are interposed between the inputs and output. A signal that controls open/close of the transfer gate is outputted from a control signal generation unit 5. The output select circuit 3 is configured as shown in FIG. 2B.

In the control signal generation unit 5, a P-channel MOS transistors PM51 and PM52, and N-channel MOS transistors NM52 and NM51 are connected in series between the power supply VDD and the ground GND in an inverter configuration, and the two inputs are connected to the different gates of P-channel MOS transistor and N-channel MOS transistor respectively. An output from the circuit (PM51, PM52, NM52, and PM52) is latched by a flip-flop circuit (INV1 and INV2) and sent out as a control signal. When the two inputs INL and INH are both at a high level, the transfer gate (NM61 and PM62) connected to the transmission system 1 is turned on, and the transfer gate (PM61 and NM62) connected to the transmission system 2 is turned off, whereas when the two inputs INL and INH are both at a low level, the transfer gate (PM61 and NM62) connected to the transmission system 2 is turned on, and the transfer gate (NM61 and PM62) connected to the transmission system 1 is turned off.

In the present embodiment, a transfer gate-type transistor open/close unit 6 is adopted. The output of the inverter INV1 is connected to the gates of the transistors NM61 and PM61, and the output of the inverter INV2 is connected to the gates of the transistors PM62 and NM62. An output during the standby mode is prevented from increasing or decreasing corresponding to the threshold values of the transistors. In other words, the output during the standby mode is effectively prevented from going below VDD or above GND by employing the transfer gate-type transistor open/close unit where P-type and N-type transistors are combined. Transfer gate may be adopted in the first and second embodiments shown in FIGS. 1 and 4.

The operation of the present embodiment shown in FIG. 6 will be described. The case where the input IN2 for the NAND circuit is fixed at a high level is discussed. During the operation mode, ACT is at a high level and ACTB is at a low level. At this time, the virtual power supply line and power supply are both on, and the virtual power supply line is considered equal to the power supply line.

When IN rises to a high level from a low level, the signal change in the transmission system 1 is slow because the high threshold transistors are driven, and the signal change in the transmission system 2 is fast because the low threshold transistors are driven.

Therefore, two outputs with different signal change speeds are applied to the output select unit at a later stage.

An output signal from the control signal generation unit 5 changes only when the inputs from the transmission systems 1 and 2 are equal, and when they are different, it keeps the previous state. When IN changes from a low level to a high level, the signal from the transmission system 2 changes first, then the signal from the transmission system 1 changes.

Since the control signal generation unit 5 keeps transmitting a signal with a fixed level until the two signals IHL and INH change, using this fixed signal, the transfer gate on the side of the transmission system 1 is turned off and the transfer gate on the side of the transmission system 2 is turned on. By doing this, only the signal from the transmission system 2 with fast signal change speed is outputted.

When the input IN goes to a high level from a low level, the signal changes faster on the side of the transmission system 1, and the input from the transmission system 2 is cut off in the output select unit and the input from the transmission system 1 is outputted.

Therefore, only the input from the side where the signal changes at high speed always gets outputted in the present embodiment, and it can be outputted at a speed corresponding to the values of the low threshold transistors.

Likewise, when the input IN is fixed at a low level and the signal of the input IN2 for the NAND circuit changes, the signal from the transmission system where it changes at high speed is outputted.

It is possible to achieve operation at even higher speed by increasing the driving capability of the low threshold transistors in each transmission system.

For instance, by making the gate width of the low threshold transistors wider than that of the high threshold transistors, the signal change can be made faster corresponding to the increased driving capability.

Note that, if a first signal change on the slower side is caught up with a second signal change, the signal information will be destroyed. The driving capability of the low threshold transistors should be increased to an extent where this does not happen.

Next, the operation during the standby mode will be described. When entering into the standby mode, signals ACT and ACTB are set to a low level and a high level respectively, so that the cut-off transistors PM41 and NM41 are turned off, and the virtual power supply line is cut off from the power supply. As a result, any part of the circuit can be turned off by the high threshold transistors, and the subthreshold leakage can be suppressed to an amount corresponding to the high threshold values. However, in this case, the current supply from the low threshold transistors is being stopped.

In the transmission system where the low threshold transistors are turned off, the output is held even when the current supply from the low threshold transistors is stopped. In the transmission system where the low threshold transistors are turned on, the current supply from the "ON" side is stopped and the output is in a floating state.

In order to hold the final output OUT, taking advantage of the fact that the state of the transmission system set into a floating state is unequivocally determined by the output level of the transmission system before entering into the standby mode, the transfer gate of the transmission system set into a floating state should be turned off and the transfer gate of the system that latches the data should be turned on, using the output level as a determining element. In the present embodiment, it is possible to output the level of the latched data as it is because the transistor open/close unit is a transfer gate-type that combines P-type and N-type transistors.

As described in the first and second embodiments, in the case of the configuration where transistors are connected in series between the power supplies, depending upon the threshold values of the on-state transistors, the high level voltage of the output OUT is VDD—VTH (where VTH is a threshold voltage of N-channel MOS transistor), and the low level voltage of the output OUT is above the ground potential in the standby mode. In order to keep the output OUT from lowering from VDD or rising from GND, the transistor open/close unit 6 should be configured as described in the present embodiment. As described with reference to FIG. 2B, a transfer gate that combines complementary MOS transistors can be applied to the above-mentioned first and second embodiments.

Furthermore, in the present embodiment, the open/close control signal generation unit 5, used for outputting the signal from the side where the signal changes at high speed, also outputs a control signal for cutting off the input in a floating state during the standby mode. Since the first stage inverter (PM51, PM52, NM52, and NM51) in the open/close control signal generation unit 5 is configured such that, even when an input from one of the transmission systems becomes unstable, the open/close control signal generation unit 5 does not output a inverted level even in a floating state, if the input from the other transmission system is latched. The flip-flop (INV1 and INV2) latches the output of the first stage inverter (PM51, PM52, NM52, and NM51) to hold the control signal.

As described, in the embodiment shown in FIG. 6, regardless of the levels of the input IN and the input IN2 of the NAND circuit, the operation speed corresponding to the capability of the low threshold transistors is achieved during the operation mode, and the subthreshold leakage is suppressed to an amount corresponding to the high threshold transistors during the standby mode.

The present invention is described with reference to the above mentioned embodiments, however, it should be noted that the present invention is not limited to the configurations of the above mentioned embodiments, and it includes various modifications and revisions, which will readily occur to those skilled in the art, within the scope and spirit of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit comprising:
   first and second transmission systems, having input ends thereof connected in common to a signal input terminal for receiving an input signal, each including a plurality of transistors and having substantially identical logic configuration; and
   an output select unit, receiving outputs from said first and second transmission systems, for selecting an output; wherein
   said plurality of transistors constituting said first transmission system comprise transistors having relatively high threshold values and being turned off and transistors having relatively low threshold values and being turned on, when the input signal supplied to said first transmission system assumes a first value; and
   said plurality of transistors constituting said second transmission system, comprise transistors having relatively high threshold values and being turned off and transistors have relatively low threshold values and being turned on, when an input signal supplied to said second transmission system assumes a second value;
   said first and second transmission systems being set to an operation mode and to a standby mode, responsive to a control signal received; and wherein
   said output select unit outputs from an output terminal thereof an output of the transmission system where the relatively low threshold transistors are in an on-state, when said first and second transmission systems are in the operation mode, and said output select unit cuts off an output of the transmission system with an unstable output and outputs from said output terminal an output of the transmission system with a stable output, when said first and second transmission systems are in the standby mode.

2. The semiconductor integrated circuit according to claim 1, comprising:
   a first transistor with a relatively high threshold, having a control electrode for receiving the control signal and being set to an off-state in the standby mode, said first transistor provided between a first power supply and a common connection node of said transistors of first conductivity-type with the relatively low threshold values, that constitute said first and second transmission systems; and
   a second transistor with a relatively high threshold, having a control electrode for receiving the control signal and being set to an off-state in the standby mode, said second transistor being provided between a second power supply and a common connection node of said transistors of second conductivity-type with the relatively low threshold values, that constitute said first and second transmission systems.

3. The semiconductor integrated circuit according to claim 1, further comprising
   a reset unit for resetting input ends of said first and second transmission systems to said first and second values, respectively, so that the high threshold transistors of said first and second transmission systems are turned off during the standby mode.

4. The semiconductor integrated circuit according to claim 3, wherein said reset unit includes:
   a first switch, provided between said signal input terminal and the input end of said first transmission system, and controlled to be set to an off-state and to an on-state, when said control signal indicates the standby mode and the operation mode, respectively;
   a second switch provided between said signal input terminal and the input end of said second transmission system, and controlled to be set to an off-state and to an on-state, when said control signal indicates the standby mode and the operation mode, respectively;
   a third switch, connected between the input end of said first transmission system and one of first and second power supplies, and controlled to be set to an on-state and to an off-state, when said control signal indicates the standby mode and the operation mode, respectively; and
   a fourth switch connected between the input end of said second transmission system and the other one of said first and second power supplies, and controlled to be set to an on-state and to an off-state, when said control signal indicates the standby mode and the operation mode, respectively.

5. The semiconductor integrated circuit according to claim 1, wherein said output select unit includes:
   a first circuit, connected to output ends of said first and second transmission systems, outputting from an output end thereof an output value corresponding to output values of said first and second transmission systems, when the output values of said first and second transmission systems are at the same logic level, and setting the output end into a floating state, when the output values of said first and second transmission systems are different;
   a flip-flop circuit receiving and storing the output of said first circuit; and
   first and second switches connected between the output end of said first transmission system and said output terminal, and the output end of said second transmission system and said output terminal respectively, each having a control electrode for receiving an output of said flip-flop circuit, and being controlled so that when one is turned on, the other is turned off.

6. The semiconductor integrated circuit according to 5, wherein said flip-flop circuit includes:
   a first inverter having an input thereof end connected to an output end of said first circuit; and
   a second inverter having an input end thereof connected to an output end of said first inverter, and having an output end thereof connected to the input end of said first inverter.

7. The semiconductor integrated circuit according to 1, wherein said output select unit includes:
   a first circuit connected to the output end of said first and second transmission systems, and set to an inactive state and to an active state, when said control signal indicates the standby mode and the operation mode, respectively;
   said first circuit, in case of said control signal indicating the standby mode, outputting a logic level corresponding to output values of said first and second transmission systems when the output values of said first and second transmission systems are at the same level, and setting an output thereof in a floating state when output values of said first and second transmission systems are different;
   an inverter circuit having an input end for receiving an output of said first circuit;
   a second circuit connected to the output ends of said first and second transmission systems, set to an active state and to an inactive state, when said control signal indicates the standby mode and the operation mode, respectively;
   said second circuit, in case of said control signal indicating the standby mode, setting the input end of said inverter circuit to a prescribed logic value, when output values of said first and second transmission systems are at the same level, and holding the input end value of said inverter circuit at said prescribed logic value, when output values of said first and second transmission systems are different; and
   first and second switches connected between the output end of said first transmission system and said output terminal, and the output end of said second transmission system and said output terminal respectively, each having a control electrode for receiving an output of said flip-flop circuit, and controlled so that one is turned off when the other is turned on.

8. The semiconductor integrated circuit according to 5, wherein said first and second switches include first and second transistors of opposite conductivity types, respectively.

9. The semiconductor integrated circuit according to 5, wherein said first and second switches include first and second transfer gates, each having two transistors of opposite conductivity types disposed in parallel.

10. The semiconductor integrated circuit according to 1, wherein said first and second transmission systems include plural stages of cascade-connected unit circuits, said unit circuit comprising an inverter elements or a prescribed logic gate element.

11. A semiconductor integrated circuit comprising first and second transmission systems having input ends connected in common to a signal input terminal; wherein said first transmission system includes:

an odd-number stage circuit comprising a transistor of a first conductivity-type with a relatively low threshold value and a transistor of a second conductivity-type with a relatively high threshold value, each of said transistors having a control electrode connected in common to said input end or an output of the preceding stage circuit and having respective second and first electrodes connected in common to an output end; and an even-number stage circuit comprising a transistor of a first conductivity-type with a relatively high threshold value and a transistor of a second conductivity-type with a relatively low threshold value, each of said transistors having a control electrode connected in common to said input end or an output of the preceding stage circuit and having respective second and first electrodes connected in common to an output end; wherein said second transmission system includes:

an odd-number stage circuit comprising a transistor of a first conductivity-type with a relatively high threshold value and a transistor of a second conductivity-type with a relatively low threshold value, each of said transistors having a control electrode connected in common to said input end or an output of the preceding stage circuit and having respective second and first electrodes connected in common to an output end; and an even-number stage circuit comprising a transistor of a first conductivity-type with a relatively low threshold value and a transistor of a second conductivity-type with a relatively high threshold value, each of said transistors having a control electrode connected in common to said input end or an output of the preceding stage circuit and having respective second and first electrodes connected in common to an output end; and wherein the second electrodes of said transistors of the first conductivity-type with relatively low threshold values in said first and second transmission systems are connected in common to said first power supply via a first switch on/off controlled by a signal supplied to a control terminal thereof;

the second electrodes of said transistors of the second conductivity-type with relatively low threshold values in said first and second transmission systems are connected in common to said second power supply via a second switch on/off controlled by a signal supplied to a control terminal thereof;

the second electrodes of said transistors of the first conductivity-type with relatively high threshold values in said first and second transmission systems are connected to said first power supply; and the second electrodes of said transistors of the second conductivity-type with relatively high threshold values in said first and second transmission systems are connected to said second power supply;

said semiconductor integrated circuit further comprising:

a third switch connected between the output end of said first transmission system and an output terminal, and on/off controlled by a signal supplied to a control terminal thereof;

a fourth switch connected between the output end of said second transmission system and the output terminal, and on/off controlled by a signal supplied to a control terminal thereof;

a first circuit, connected to output ends of said first and second transmission systems, outputting an output value corresponding to the values of the output ends of said first and second transmission systems and setting an output end thereof into a floating state, when values of the output ends of said first and second transmission systems are identical and are different, respectively; and a flip-flop circuit having an input end connected to an output of said first circuit, holding and outputting the value immediately before when the output of said first circuit is in a floating state, an output of said flip-flop circuit supplied to a control terminal of said third and fourth switches.

12. The semiconductor integrated circuit according to 11, wherein said first switch includes a transistor of the first conductivity-type with relatively high threshold value, and said second switch includes a transistor of the second conductivity-type with relatively high threshold values.

13. A semiconductor integrated circuit comprising first and second transmission systems having input ends connected in common to a signal input terminal; wherein said first transmission system includes:

an odd-number stage circuit comprising a transistor of a first conductivity-type with a relatively low threshold value and a transistor of a second conductivity-type with a relatively high threshold value, each of said transistors having a control electrode connected in common to said input end or an output of the preceding stage circuit and having respective second and first electrodes connected in common to an output end; and an even-number stage circuit comprising a transistor of a first conductivity-type with a relatively high threshold value and a transistor of a second conductivity-type with a relatively low threshold value, each of said transistors having a control electrode connected in common to said input end or an output of the preceding stage circuit and having respective second and first electrodes connected in common to an output end; and wherein said second transmission system includes:

an odd-number stage circuit comprising a transistor of a first conductivity-type with a relatively high threshold value and a transistor of a second conductivity-type with a relatively low threshold value, each of said transistors having a control electrode connected in common to said input end or an output of the preceding stage circuit and having respective second and first electrodes connected in common to an output end; and an even-number stage circuit comprising a transistor of a first conductivity-type with a relatively low threshold value and a transistor of a second conductivity-type with a relatively high threshold value, each of said transistors having a control electrode connected in common to said input end or an output of the preceding stage circuit and having respective second and first electrodes connected in common to an output end;

said semiconductor integrated circuit further comprising:

a first switch connected between an output end of said first transmission system and an output terminal, and on/off controlled by a signal supplied to a control terminal thereof;

a second switch connected between an output end of said second transmission system and said output terminal, and on/off controlled by a signal supplied to a control terminal thereof;

a third switch connected between said signal input terminal and the input end of said first transmission system, and controlled to be in an off-state when a control signal received indicates a standby mode;

a fourth switch connected between said signal input terminal and the input end of said second transmission system, and having an output end set to be in an off-state when said control signal received indicates a standby mode;

a fifth switch connected between the input end of said first transmission system and one of first and second power supplies, and set to be in an on-state when said control signal received indicates a standby mode;

a sixth switch connected between the input end of said second transmission system and the other of said first and second power supplies, and set to be in an on-state when said control signal received indicates a standby mode;

a first control circuit, set to an active state, when said control signal indicates an operation mode to be connected to the output ends of said first and second transmission systems, outputting a logic value corresponding to the values of the output ends of said first and second transmission systems and setting an output thereof into a floating state, when values of the output ends of said first and second transmission systems are identical and are different, said first control circuit set to an inactive state when said control signal indicates a standby mode;

an inverter circuit having an input end for receiving an output of said first circuit;

a second circuit, connected to the output ends of said first and second transmission systems, and set to an active state when said control signal indicates the standby mode, for supplying to the input end of said inverter circuit a logic value corresponding to output values of said first and second transmission systems, when the output values of said first and second transmission systems are at the same level, and for holding the input end of said inverter circuit at said set logic value when output values of said first and second transmission systems are different, said second circuit set to an inactive state when said control signal indicates the operation mode, an output of said inverter circuit being connected to control terminals of said first and second switches.

* * * * *